United States Patent
Hung et al.

(10) Patent No.: US 10,998,433 B2
(45) Date of Patent: May 4, 2021

(54) SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventors: Hung Hung, Kawasaki (JP); Yasuhiro Isobe, Ota (JP); Akira Yoshioka, Yokohama (JP); Toru Sugiyama, Musashino (JP); Masaaki Iwai, Yokohama (JP); Naonori Hosokawa, Yokohama (JP); Masaaki Onomura, Setagaya (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 69 days.

(21) Appl. No.: 16/559,210

(22) Filed: Sep. 3, 2019

(65) Prior Publication Data
US 2020/0295171 A1    Sep. 17, 2020

(30) Foreign Application Priority Data
Mar. 15, 2019    (JP) .............................. JP2019-048043

(51) Int. Cl.
*H01L 29/778*    (2006.01)
*H01L 29/40*    (2006.01)
(Continued)

(52) U.S. Cl.
CPC ........ *H01L 29/7786* (2013.01); *H01L 29/404* (2013.01); *H01L 29/0619* (2013.01); *H01L 29/2003* (2013.01); *H01L 29/4236* (2013.01)

(58) Field of Classification Search
CPC . H01L 29/7786; H01L 29/404; H01L 29/619; H01L 29/4236; H01L 29/2003; H01L 29/1066; H01L 29/402
(Continued)

(56) References Cited

U.S. PATENT DOCUMENTS 9,093,512 B2    7/2015    Ohki
2005/0253168 A1    11/2005    Wu et al.
(Continued)

FOREIGN PATENT DOCUMENTS

JP    2013-153189 A    8/2013
JP    2015-170821 A    9/2015
(Continued)

OTHER PUBLICATIONS

U.S. Appl. No. 16/290,714, filed Mar. 1, 2019.

*Primary Examiner* — Thinh T Nguyen
(74) *Attorney, Agent, or Firm* — Oblon, McClelland, Maier & Neustadt, L.L.P.

(57) ABSTRACT

A semiconductor device of an embodiment includes a first nitride semiconductor layer; a second nitride semiconductor layer placed on the first nitride semiconductor layer; a first electrode placed on the second nitride semiconductor layer; a second electrode placed on the first nitride semiconductor layer; a gate electrode placed between the first electrode and the second electrode; a first field plate electrode placed on the second nitride semiconductor layer, the first field plate electrode having the same height as the gate electrode; and a second field plate electrode provided on an upper side of the first field plate electrode, the second field plate electrode being placed on a side of the second electrode compared to the first field plate electrode.

9 Claims, 5 Drawing Sheets

(51) Int. Cl.
    *H01L 29/06*     (2006.01)
    *H01L 29/20*     (2006.01)
    *H01L 29/423*     (2006.01)

(58) Field of Classification Search
    USPC .................... 257/76, 194, 367; 438/167, 172
    See application file for complete search history.

(56)                 References Cited

U.S. PATENT DOCUMENTS

| | | | |
|---|---|---|---|
| 2009/0108299 A1* | 4/2009 | Smorchkova et al. | ...................... H01L 29/7783 257/194 |
| 2017/0200818 A1 | 7/2017 | Suzuki et al. | |
| 2020/0091331 A1 | 3/2020 | Hung et al. | |

FOREIGN PATENT DOCUMENTS

| | | |
|---|---|---|
| JP | 5776217 B2 | 9/2015 |
| JP | 2017-123432 A | 7/2017 |
| JP | 2020-47741 A | 3/2020 |

\* cited by examiner

Fig.8

SEMICONDUCTOR DEVICE

CROSS-REFERENCE TO RELATED APPLICATION

This application is based upon and claims the benefit of priority from Japanese Patent Application No. 2019-048043, filed on Mar. 15, 2019, the entire contents of which are incorporated herein by reference.

FIELD

Embodiments described herein relate generally to a semiconductor device.

BACKGROUND

A semiconductor element such as a transistor or a diode is used in a circuit such as a switching power-supply circuit or an inverter circuit. Such semiconductor elements need a high breakdown voltage and low on-resistance. With respect to a relationship between a breakdown voltage and on-resistance, there is a trade-off relationship determined depending on an element material.

By progress in technology development, low on-resistance close to a limit of silicon that is a main element material is realized with respect to a semiconductor element. To further improve a breakdown voltage or to further reduce on-resistance, it is necessary to change an element material. By using a nitride semiconductor such as a gallium nitride or an aluminum gallium nitride as an element material of a semiconductor element, it is possible to improve a trade-off relationship determined depending on the element material. Thus, it is possible to improve a breakdown voltage or to reduce on-resistance of a semiconductor element significantly.

A gate-to-drain charge amount standardized by on-resistance $R_{on}$, $Q_{GD}$ is known as a characteristic index of switching efficiency of a transistor using a nitride semiconductor. It is necessary to lower $R_{on}$ $Q_{CD}$ in order to improve switching efficiency.

DETAILED DESCRIPTION

A semiconductor device of an embodiment includes a first nitride semiconductor layer; a second nitride semiconductor layer placed on the first nitride semiconductor layer, the second nitride semiconductor layer having a larger bandgap than the first nitride semiconductor layer; a first electrode placed on the second nitride semiconductor layer, the first electrode being electrically connected to the first nitride semiconductor layer; a second electrode placed on the first nitride semiconductor layer, the second electrode being electrically connected to the first nitride semiconductor layer; a gate electrode placed between the first electrode and the second electrode; a first field plate electrode placed on the second nitride semiconductor layer, the first field plate electrode having the same height as the gate electrode; and a second field plate electrode provided on an upper side of the first field plate electrode, the second field plate electrode being placed on a side of the second electrode compared to the first field plate electrode.

In the following, embodiments of the present disclosure will be described with reference to the drawings. Note that in the following description, the same sign is assigned to identical or similar members and there is a case where a description of a member described once is omitted.

In the present description, a "nitride semiconductor layer" includes a "GaN-based semiconductor." The "GaN-based semiconductor" is a general term of a semiconductor including a gallium nitride (GaN), an aluminum nitride (AlN), an indium nitride (InN), and intermediate compositions thereof.

In the present description, "undoped" means that an impurity concentration is equal to or lower than $2\times10^{16}$ $cm^{-3}$.

In the present description, an upper direction in a drawing is described as an "upper side" and a lower direction in the drawing is described as a "lower side" in order to indicate a positional relationship between parts or the like. In the present description, concept of the "upper side" and the "lower side" is not necessarily a term indicating a relationship with a direction of gravity.

First Embodiment

A semiconductor device of the first embodiment includes: a first nitride semiconductor layer; a second nitride semiconductor layer placed on the first nitride semiconductor layer, the second nitride semiconductor layer having a larger bandgap than the first nitride semiconductor layer; a first electrode placed on the first nitride semiconductor layer, the first electrode being electrically connected to the first nitride semiconductor layer; a second electrode placed on the first nitride semiconductor layer, the second electrode being electrically connected to the first nitride semiconductor layer; a gate electrode placed between the first electrode and the second electrode; a first field plate electrode placed on the second nitride semiconductor layer, the first field plate electrode having the same height as the gate electrode; and a second field plate electrode placed between the first field plate electrode and the second electrode.

Figure 1:
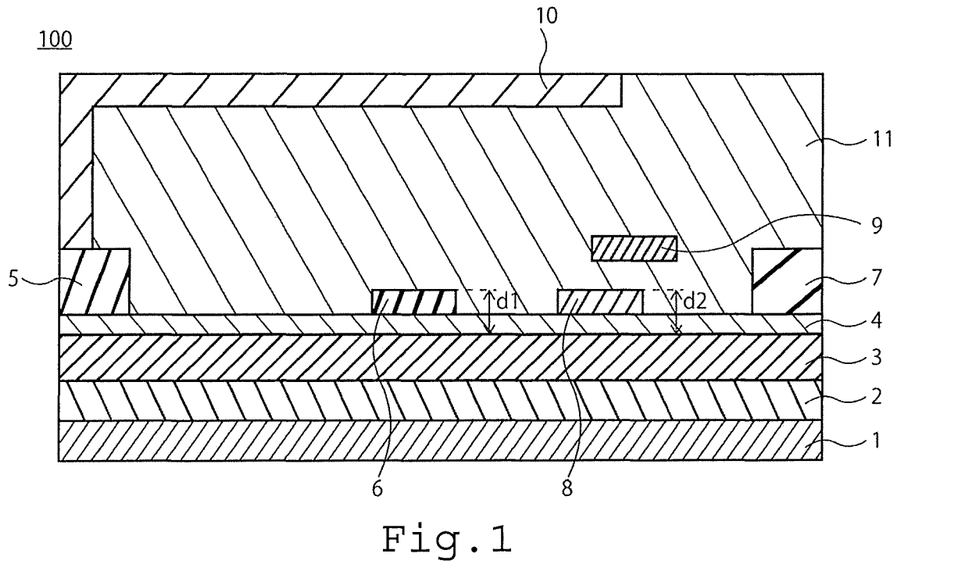
FIG. 1 is a schematic sectional view of a semiconductor device of a first embodiment.

FIG. 1 is a schematic sectional view of a semiconductor device of the first embodiment. The semiconductor device is a high electron mobility transistor (HEMT) 100 using a GaN-based semiconductor.

The HEMT 100 includes a substrate 1, a buffer layer 2, a channel layer 3 (first nitride semiconductor layer), a barrier layer 4 (second nitride semiconductor layer), a source electrode 5 (first electrode), a gate electrode 6, a drain electrode 7 (second electrode), a first field plate electrode 8, a second field plate electrode 9, a third field plate electrode 10, and an interlayer insulation layer 11.

The substrate 1 includes silicon (Si), for example. Other than silicon, sapphire ($Al_2O_3$) or silicon carbide (SiC) can be applied, for example.

The buffer layer 2 is provided on the substrate 1. The buffer layer 2 has a function of reducing a lattice mismatch between the substrate 1 and the channel layer 3. The buffer layer 2 includes, for example, a multi-layer structure of an aluminum gallium nitride ($Al_wGa_{1-w}N$ ($0<W\leq1$)).

The channel layer 3 is provided on the buffer layer 2. The channel layer 3 is also called an electron transit layer. The channel layer 3 is, for example, an undoped aluminum gallium nitride ($Al_XGa_{1-X}N$ ($0\leq X<1$)). More specifically, for example, the channel layer 3 is an undoped gallium nitride (GaN). A thickness of the channel layer 3 is, for example, equal to or larger than 0.1 μm and equal to or smaller than 10 μm. A thickness in embodiments is a length (height) of each of members including the channel layer 3 in a laminate direction of the channel layer 3 and the barrier layer 4.

The barrier layer 4 is provided on the channel layer 3. The barrier layer 4 is also called an electron supply layer. A bandgap of the barrier layer 4 is larger than a bandgap of the channel layer 3. The barrier layer 4 is, for example, an undoped aluminum gallium nitride ($Al_YGa_{1-Y}N$ ($0<Y\leq1$, $X<Y$)). More specifically, for example, the barrier layer 4 is undoped $Al_{0.25}Ga_{0.75}N$. A thickness of the barrier layer 4 is, for example, equal to or larger than 2 nm and equal to or smaller than 100 nm.

There is a hetero junction interface between the channel layer 3 and the barrier layer 4. Two-dimensional electron gas (2DEG) is formed in the hetero junction interface and becomes a carrier of the HEMT 100.

The first electrode 5 is, for example, a source electrode. The source electrode 5 is provided above the channel layer 3 and the barrier layer 4. The source electrode 5 is electrically connected to the channel layer 3 and the barrier layer 4. For example, the source electrode 5 is directly in contact with the barrier layer 4.

The source electrode 5 is, for example, a metallic electrode. The source electrode 5 is, for example, a laminate structure of titanium (Ti) and aluminum (Al). It is preferable that the source electrode 5 and the barrier layer 4 are in an ohmic contact.

The gate electrode 6 is provided above the channel layer 3 and the barrier layer 4. The gate electrode 6 is electrically connected to the channel layer 3 and the barrier layer 4. For example, the gate electrode 6 is directly in contact with the barrier layer 4. The gate electrode 6 is provided between the source electrode 5 and the drain electrode 7.

The gate electrode 6 is, for example, a titanium nitride (TiN).

It is also possible to configure a semiconductor device 100 as a metal insulator semiconductor (MIS)-type HEMT by providing a gate insulation film (not illustrated) between the gate electrode 6 and the barrier layer. A gate insulation layer is, for example, oxide or oxynitride. The gate insulation layer is, for example, a silicon oxide, an aluminum oxide, a silicon oxynitride, or an aluminum oxynitride.

The drain electrode 7 is provided above the channel layer 3 and the barrier layer 4. The drain electrode 7 is electrically connected to the channel layer 3 and the barrier layer 4. For example, the drain electrode 7 is in contact with the barrier layer 4.

The drain electrode 7 is, for example, a metallic electrode. The drain electrode 7 is, for example, a laminate structure of titanium (Ti) and aluminum (Al). It is preferable that the drain electrode 7 and the barrier layer 4 are in an ohmic contact.

A distance between the source electrode 5 and the drain electrode 7 is, for example, equal to or longer than 5 μm and equal to or shorter than 30 μm.

Note that the source electrode 5 and the drain electrode 7 can have a structure of being in contact with the channel layer 3 directly.

The first field plate electrode 8 is placed on the barrier layer 4. It is preferable that the first field plate electrode 8 has the same height as the gate electrode 6. The height of the gate electrode 6 is a distance (d1) from the channel layer 3 to an upper surface (surface on opposite side of channel layer 3 side) of the gate electrode 6, and the height of the first field plate electrode 8 is a distance (d2) from the channel layer 3 to an upper surface (surface on opposite side of channel layer 3 side) of the first field plate electrode 8. When $|d1-d2|/(d1+d2)\leq0.05$ is satisfied, the height of the first field plate electrode 8 and the height of the gate electrode 6 are the same.

The first field plate electrode 8 is electrically connected with the source electrode 5. The first field plate electrode 8 reduces an electric field in a lateral direction. Although the first field plate electrode 8 is directly in contact with the barrier layer 4 in FIG. 1, a layer not illustrated in FIG. 1 may be provided between the barrier layer 4 and the first field plate electrode 8. The first field plate electrode 8 is physically spaced apart from the gate electrode 6 and the drain electrode 7. The first field plate electrode 8 is placed between the gate electrode 6 and the drain electrode 7.

In order to make the first field plate electrode 8 and the gate electrode 6 have the same height, the gate electrode 6 and the first field plate electrode 8 are preferably metallic films formed in the same process. That is, the first field plate electrode 8 preferably are the same conductive material and the same thickness as the gate electrode 6.

In a case of seen in a thickness direction of the substrate, the second field plate electrode 9 is provided on an upper side of the first field plate electrode 8, and at least a part thereof is placed on a side of the drain electrode 7 compared to the first field plate electrode 8. The second field plate electrode 9 is placed in a manner of being spaced apart from the channel layer 3 and the barrier layer 4. The second field plate electrode 9 reduces an electric field in the lateral direction. An interlayer insulation film 11 is placed between the second field plate electrode 9 and the barrier layer 4. The second field plate electrode 9 has the same potential as the source electrode 5. A thickness of the second field plate electrode 9 is ten times or more of the thickness of the first field plate electrode 8. The second field plate electrode 9 is electrically connected with the source electrode 5.

By combination of the first field plate electrode 8 and the second field plate electrode 9, it is possible to reduce gate-to-drain capacitance while reducing source-to-drain electric field concentration.

The third field plate electrode 10 is electrically connected with the source electrode 5, extended in a direction of the drain electrode 7, and placed on an upper side of the gate electrode 6. The third field plate electrode 10 reduces an electric field in the lateral direction. The third field plate electrode 10 has the same potential as the source electrode 5. The gate electrode 5, the first field plate electrode 8, and the second field plate electrode 9 are placed between an extended part of the third field plate electrode 10 and the second nitride semiconductor layer 4. In the laminate direction of the channel layer 3 and the barrier layer 4, the second field plate electrode 9 is placed between the first field plate electrode 8 and the third field plate electrode 10. An end surface on a side of the drain electrode 7 of the third field plate electrode 10 is placed on the side of the drain electrode 7 compared to an end surface on the side of the drain electrode 7 of the second field plate electrode 9.

The first to third field plate electrodes of the embodiment are not directly connected to each other in the cross section illustrated in FIG. 1. The cross section illustrated in FIG. 1 is a surface in parallel with the thickness direction of the substrate 1 (surface vertical to surface on side of barrier layer 4 of channel layer 3 including line segment extending from source electrode 5 to drain electrode 7), and is a surface including the gate electrode 6, the first field plate electrode 8, and the second field plate electrode 9. The source electrode 5 is connected to a source pad (not illustrated). The field plate electrodes described in the embodiment are connected, for example, to the source pad.

The interlayer insulation film 11 is, for example, oxide or nitride. The interlayer insulation film 11 is, for example, a silicon oxide ($SiO_2$), a silicon nitride (SiN), a high-dielectric constant (high-k) material, or the like. As the high-k material, there is a hafnium oxide ($HfO_2$) or the like.

A kind of an element and an element concentration in a semiconductor layer or a semiconductor region can be measured, for example, by secondary ion mass spectrometry (SIMS) or energy dispersive x-ray spectroscopy (EDX). Also, a relative level of an element concentration can be also determined from a level of a carrier concentration acquired by scanning capacitance microscopy (SCM). Also, a distance such as a depth, a thickness, a width, or an interval of an impurity region can be acquired, for example, by SIMS. Also, a distance such as a depth, a thickness, a width, or an interval of an impurity region can be acquired from a comparison image of an SCM image and an atom probe image.

Gate-to-drain capacitance is decreased and electric field concentration is reduced compared to a comparison form with no first field plate electrode 8 and no second field plate electrode 9.

Second Embodiment

Figure 2:
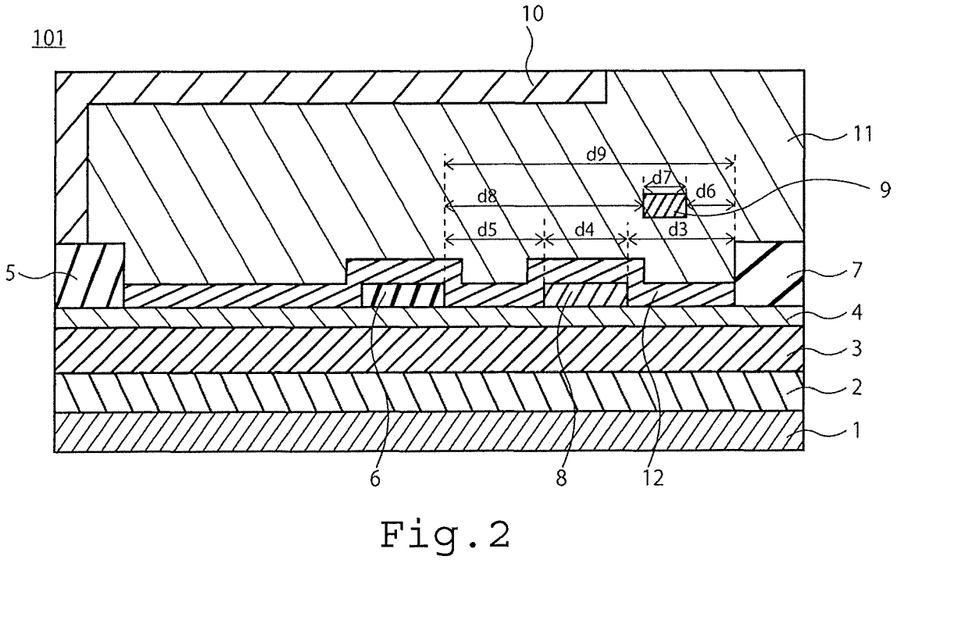
FIG. 2 is a schematic sectional view of a semiconductor device of a second embodiment.

A semiconductor device of the second embodiment is a modification example of the semiconductor device of the first embodiment. A schematic sectional view of a semiconductor device 101 of the second embodiment is illustrated in FIG. 2. The semiconductor device 101 of the second embodiment is in common with the semiconductor device 100 of the first embodiment except for a point that an insulation film 12 is included on a first field plate electrode 8. In an embodiment including a modification example of the first embodiment, a part or whole of a changed or added configuration can be adopted to a different embodiment.

In the cross section in FIG. 1 or FIG. 2, a first field plate electrode 8 and a second field plate electrode 9 become a stairs-like field plate electrode when being in contact with each other, and electric field concentration can be reduced. However, since corresponding to a comparison form with no first field plate electrode 8, this is not preferable in terms of reduction of gate-to-drain capacitance. Thus, by providing the insulation film 12 on the first field plate electrode 8, it is possible to more securely separate the first field plate electrode 8 and the second field plate electrode 9 in the cross section in FIG. 2. Note that in a case where the insulation film 12 is not provided, the first field plate electrode 8 and the second field plate electrode 9 are separated from each other by an interlayer insulation film 11 in a manner of FIG. 1. A distance between the first field plate electrode 8 and the second field plate electrode 9 in a laminate direction of a channel layer 3 and a barrier layer 4 is preferably equal to or longer than 0.05 μm and equal to or shorter than 0.5 μm regardless of existence/non-existence of the insulation film 12.

A positional relationship between a gate electrode 6, a first field plate electrode 8, and a second field plate electrode 9 including a case of the second embodiment will be described with the semiconductor device 101 of the second embodiment as an example. In FIG. 2, a distance between conductive members and a width of each conductive member in a direction from a source electrode 5 toward a drain electrode 7 are indicated by signs d3 to d8. A distance d3 is a distance between the first field plate electrode 8 and the drain electrode 7. A distance d4 is a width of the first field plate electrode 8 in the direction from the source electrode 5 toward the drain electrode 7. A distance d5 is a distance between the gate electrode 6 and the first field plate electrode 8. A distance d6 is a distance between the second field plate electrode 9 and the drain electrode 7 in the direction from the source electrode 5 toward the drain electrode 7. A distance d7 is a width of the second field plate electrode 9 in the direction from the source electrode 5 toward the drain electrode 7. A distance d8 is a distance between the second field plate electrode 9 and the gate electrode 6 in the direction from the source electrode 5 toward the drain electrode 7. A distance d9 is a distance between the gate electrode 6 and the drain electrode 7.

In terms of reduction of a peak in a gate-to-drain electric field, it is preferable that the distance d3 and the distance d6 satisfy a relationship of d3>d6. From the same point of view, it is more preferable that the distance d3 and the distance d6 satisfy a relationship of d3>1.1d6. When the distance d6 is too short, an electric field is likely to concentrate on an end part on a side of the drain electrode 7 of the second field plate electrode 9. Thus, the distance d6 is preferably equal to or longer than 2.0 μm and equal to or shorter than 20 μm. Also, when the distance d9 between the gate electrode 6 and the drain electrode 7 is a reference, $0.7d9 \leq d6 \leq 0.9d9$ is preferably satisfied in terms of reduction of Cgd.

The distance d4 and the distance d7 preferably satisfy a relationship of d4>d7 in terms of reduction of a peak in a gate-to-drain electric field. From the same point of view, a relationship of d4>1.5d7 is preferably satisfied. In terms of reduction of Cgd, the distance d4 is preferably equal to or longer than 1.0 m and equal to or shorter than 6.0 μm. From the same point of view, the distance d4 is more preferably equal to or longer than 2.0 μm and equal to or shorter than 5.0 μm.

In terms of reduction of a peak in a gate-to-drain electric field, the distance d5 preferably satisfies $0.0\ \mu m < d5 \leq 10\ \mu m$. From the same point of view, the distance d5 preferably satisfies $0.5\ \mu m < d5 \leq 3.0\ \mu m$.

In terms of reduction of a peak in a gate-to-drain electric field, the distance d8 preferably satisfies $0.1\ \mu m < d8 \leq 2.5\ \mu m$. The distance d5 and the distance d8 may satisfy a relationship of d5>d8 or may satisfy a relationship of d5≤d8. That is, an end surface on a side of the gate electrode 6 of the second field plate electrode 9 may be placed on the side of the gate electrode 6 compared to an end surface on the side of the gate electrode 6 of the first field plate electrode 8.

The first field plate electrode 8 and the second field plate electrode 9 may overlap with each other at least in a part in the laminate direction of the channel layer 3 and the barrier layer 4. When overlapping with each other in the laminate direction of the channel layer 3 and the barrier layer 4, the first field plate electrode 8 and the second field plate electrode 9 satisfy a relationship of (d4+d5)>d8.

Third Embodiment

Figure 3:
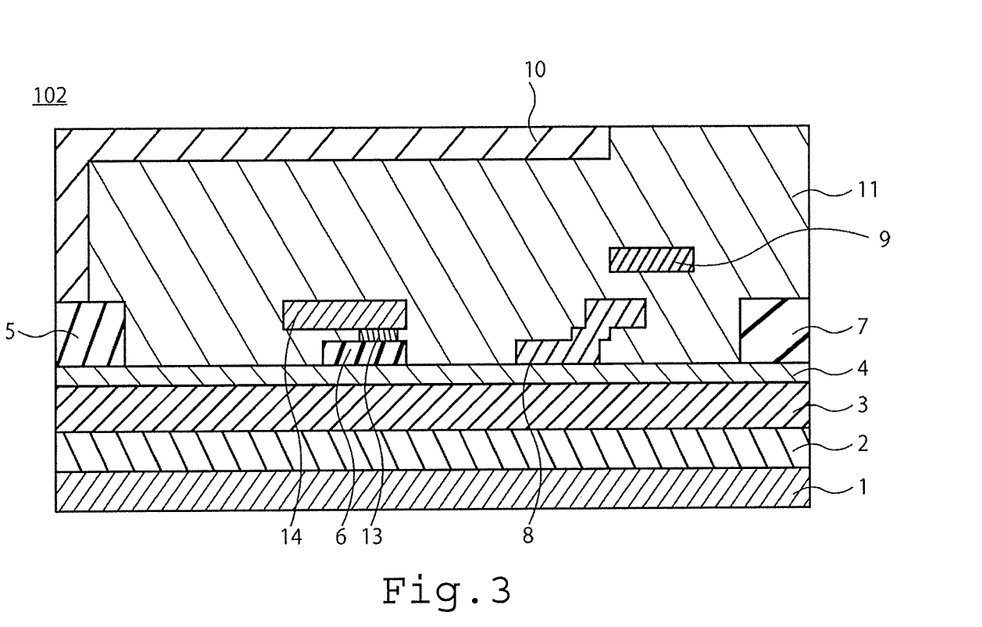
FIG. 3 is a schematic sectional view of a semiconductor device of a third embodiment.

A semiconductor device of the third embodiment is a modification example of the semiconductor device of the first embodiment. In FIG. 3, a schematic sectional view of a semiconductor device 102 of the third embodiment is illustrated. The semiconductor device 102 of the third embodiment is in common with the semiconductor device of the first embodiment except for a point that a first conductive layer 13 and a second conductive layer 14 are included on a gate electrode 6 and a first field plate electrode 8 has a stairs-like shape.

The first conductive layer 13 is placed on the gate electrode 6 and is electrically connected with the gate electrode 6. The first conductive layer 13 is a contact of the gate electrode 6 and the second conductive layer 14. In the sectional view in FIG. 3, the first conductive layer 13 is electrically and directly connected with the gate electrode 6 and the second conductive layer 14. The first conductive layer 13 is placed between the gate electrode 6 and the second conductive layer 14. A distance between the first conductive layer 13 and the drain electrode 7 is equal to or longer than a distance d9 between the gate electrode 6 and the drain electrode 7. A width of the first conductive layer 13 (distance in direction from source electrode 5 toward drain electrode 7) is narrower than a width of the gate electrode 6. For example, the width of the first conductive layer 13 is 0.5 times or narrower of the width of the gate electrode 6.

The first conductive layer 13 is, for example, a metallic layer. The first conductive layer 13 is, for example, aluminum. Electrical resistivity (Ωm ohm·m) of the first conductive layer 13 is lower than electrical resistivity (Ωm ohm·m) of the gate electrode 6. Since the first conductive layer 13 has lower resistance than the gate electrode 6, electrical resistance of whole members from the gate electrode 6 to the second conductive layer 14 can be reduced. The electrical resistivity (Ωm ohm·m) of the first conductive layer 13 is preferably a half or lower of the electrical resistivity (Ωm ohm·m) of the gate electrode 6 in terms of reduction of the resistance.

The second conductive layer 14 is placed on the first conductive layer 13 and is electrically connected with the first conductive layer 13. In the sectional view in FIG. 3, the second conductive layer 14 is electrically and directly connected with the first conductive layer 13. The second conductive layer 14 is placed between the third field plate electrode 10 and the first conductive layer 13. A distance between the second conductive layer 14 and the drain electrode 7 is equal to or longer than the distance d9 between the gate electrode 6 and the drain electrode 7.

The second conductive layer 14 is, for example, a metallic layer. The second conductive layer 14 is, for example, aluminum. Electrical resistivity (Ωm ohm·m) of the second conductive layer 14 is lower than electrical resistivity (Ωm ohm·m) of the gate electrode 6. Since the second conductive layer 14 has lower resistivity than the gate electrode 6, electrical resistance in whole members from the gate electrode 6 to the second conductive layer 14 can be reduced. Electrical resistivity (Ωm ohm·m) of the first conductive layer 13 and electrical resistivity (Ωm ohm·m) of the second conductive layer 14 is preferably a half or less of the electrical resistivity (Ωm ohm·m) of the gate electrode 6 in terms of reduction of resistance.

By providing the first conductive layer 13 and the second conductive layer 14, it is possible to acquire a good electric field distribution while reducing $Q_{GD}$. End surfaces on a side of the drain electrode 7 of the first conductive layer 13 and the second conductive layer 14 are placed on a side of the source electrode 5 compared to an end surface on the side of the drain electrode 7 of the gate electrode 6. That is, no field plate electrode is provided in the gate electrode 6. It is possible to control a peak in a gate-to-drain electric field by adopting a gate field plate. However, gate-to-drain capacitance is increased. By adopting a configuration of an electric field embodiment, it is possible to control a peak in a gate-to-drain electric field and to further reduce $Q_{GD}$. It is possible to control electric field concentration by controlling a peak in the gate-to-drain electric field. The semiconductor device 102 has a superior switching characteristic since a peak in the gate-to-drain electric field is reduced and $Q_{GD}$ is low.

A thickness (distance in direction from channel layer 3 toward barrier layer 4) of the second conductive layer 14 is preferably ten times or more of a thickness of the gate electrode 6. By using the second conductive layer 14 having enough thickness with respect to the gate electrode 6, resistance between the second conductive layer 14 and the gate electrode 6 is reduced.

When a width (distance in direction from source electrode 5 toward drain electrode 7) of the second conductive layer 14 is narrow, an effect of reducing resistance is small. Thus, it is preferable that an end surface on the side of the source electrode 5 of the second conductive layer 14 is placed on the side of the source electrode 5 compared to an end surface on the side of the source electrode 5 of the gate electrode 6.

Fourth Embodiment

Figure 4:
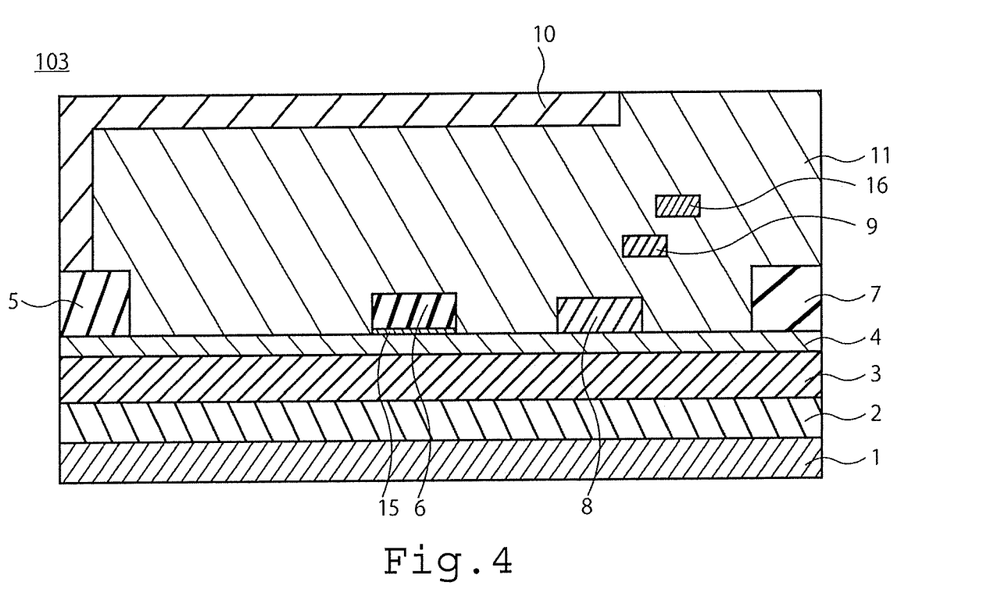
FIG. 4 is a schematic sectional view of a semiconductor device of a fourth embodiment.

A semiconductor device of the fourth embodiment is a modification example of the semiconductor device of the first embodiment. In FIG. 4, a schematic sectional view of a semiconductor device 103 of the fourth embodiment is illustrated. The semiconductor device 103 of the fourth embodiment is in common with the semiconductor device of the first embodiment except for a point that a third nitride semiconductor layer 15 is included between a gate electrode 6 and a barrier layer 4 and a fourth field plate electrode 16 is included between a second field plate electrode 9 and a drain electrode 7.

The third nitride semiconductor layer 15 is a p-type impurity-doped nitride semiconductor layer and is, for example, p-type AlGaN. Since the p-type semiconductor layer is provided under the gate electrode 6 of the semiconductor device 103, a channel right under the gate is depleted when a gate voltage is 0 V. With this form, the semiconductor device 103 can realize a normally-off operation. Since the third nitride semiconductor layer 15 is a thin layer having an extremely small thickness (such as one several tenths) compared to the gate electrode 6, the sum of the thickness of the third nitride semiconductor layer 15 and that of the gate electrode becomes equivalent to a thickness of a first field plate electrode 8.

Also, the fourth field plate electrode 16 may be further provided between the second field plate electrode 9 and the drain electrode 7. It is possible to further reduce electric field concentration by providing the fourth field plate electrode 16.

Since a normally-off operation becomes possible in addition to reduction of gate-to-drain capacitance, the semiconductor device 103 of the fourth embodiment is preferable in terms of improvement in switching efficiency.

Fifth Embodiment

Figure 5:
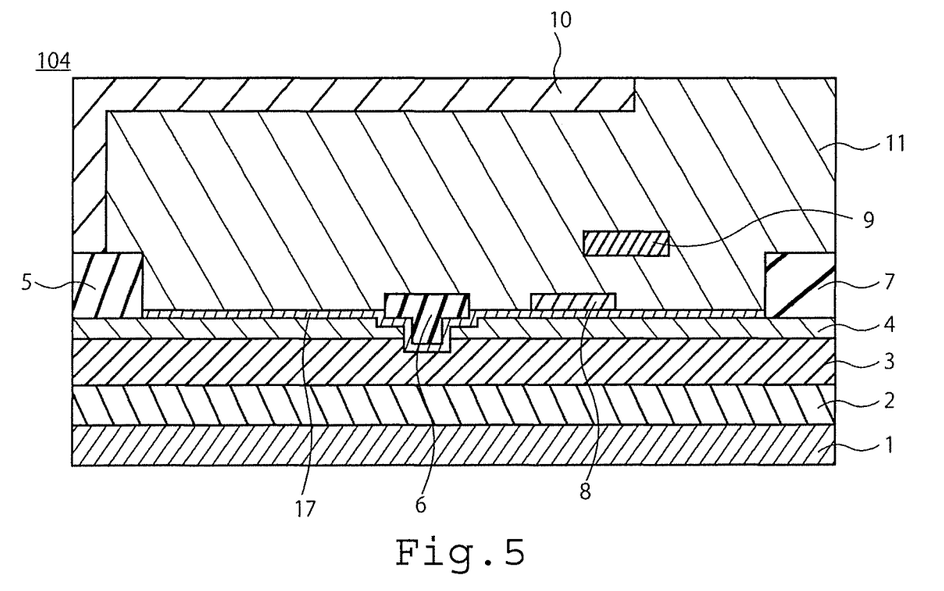
FIG. 5 is a schematic sectional view of a semiconductor device of a fifth embodiment.

A semiconductor device of the fifth embodiment is a modification example of the semiconductor device of the first embodiment. In FIG. 5, a schematic sectional view of a semiconductor device 104 of the fifth embodiment is illustrated. The semiconductor device 104 of the fifth embodiment is in common with the semiconductor device 100 of the first embodiment except for a point that a trench (recess) a bottom surface of which is placed in a channel layer 3 is included, a gate insulation film 17 is further included between a gate electrode 6 and a barrier layer 4, and the gate electrode 6 is placed in the trench. Since the bottom surface of the trench is placed in the channel layer 3, two-dimensional electron gas under the gate electrode 6 disappears. With this form, the semiconductor device 104 can realize a normally-off operation. Even in the fifth embodiment having a gate electrode 6 with a different structure, a peak in a gate-to-drain electric field and gate-to-drain capacitance are reduced and the semiconductor device 104 having a superior switching characteristic can be provided similarly to the first embodiment.

Sixth Embodiment

Figure 6:
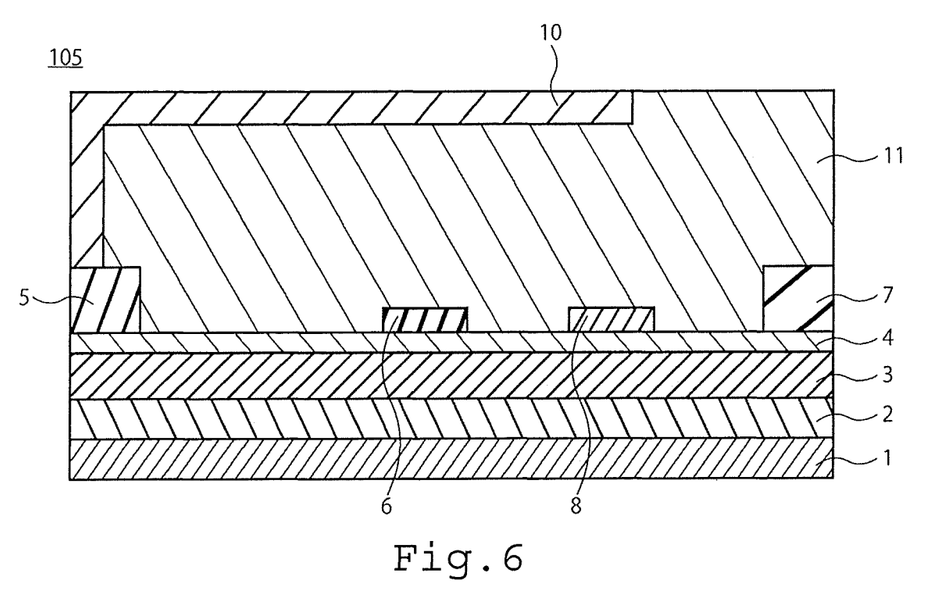
FIG. 6 is a schematic sectional view of a semiconductor device of a sixth embodiment.

The sixth embodiment relates to a semiconductor device. The semiconductor device of the sixth embodiment is partially in common with that of the first embodiment. In FIG. 6, a schematic sectional view of a semiconductor device 105 of the sixth embodiment is illustrated. The semiconductor device 105 of the sixth embodiment includes a substrate 1, a buffer layer 2, a channel layer 3, a barrier layer 4, a source electrode 5, a gate electrode 6, a drain electrode 7, a first field plate electrode 8, and an interlayer insulation layer 11. In terms of reduction of gate-to-drain capacitance, the first field plate electrode 8 is provided in such a manner as to be in contact with the barrier layer 4 directly. The first field plate electrode 8 is placed between the gate electrode 6 and the drain electrode 7 in a direction from the source electrode 5 toward the drain electrode 7 and is directly in contact with the barrier layer 4. Although a second field plate electrode 9 described in a different embodiment also has an effect of reducing gate-to-drain capacitance, gate-to-drain capacitance can be reduced more in a semiconductor device having a form in which a first field plate electrode 8 is provided without a second field plate electrode 9 than in a semiconductor device having a form in which a second field plate electrode 9 is provided without a first field plate electrode 8.

A whole surface facing the barrier layer 4 of the first field plate electrode 8 is preferably in contact with the barrier layer 4 directly.

In terms of reduction of gate-to-drain capacitance, a height of the first field plate electrode 8 is preferably the same as a height of the gate electrode 6. A preferable condition of a position of the first field plate electrode 8, or the like is in common with that of the first embodiment.

It is preferable to reduce an electric field in a lateral direction, for example, by providing a different field plate electrode other than the first field plate electrode 8. Even in a case where a different field plate electrode is provided, it is preferable to reduce gate-to-drain capacitance and to improve a switching characteristic with the first field plate electrode 8 placed between the gate electrode 6 and the drain electrode 7, the first field plate electrode 8 being in contact with the barrier layer 4 directly.

Figure 7:
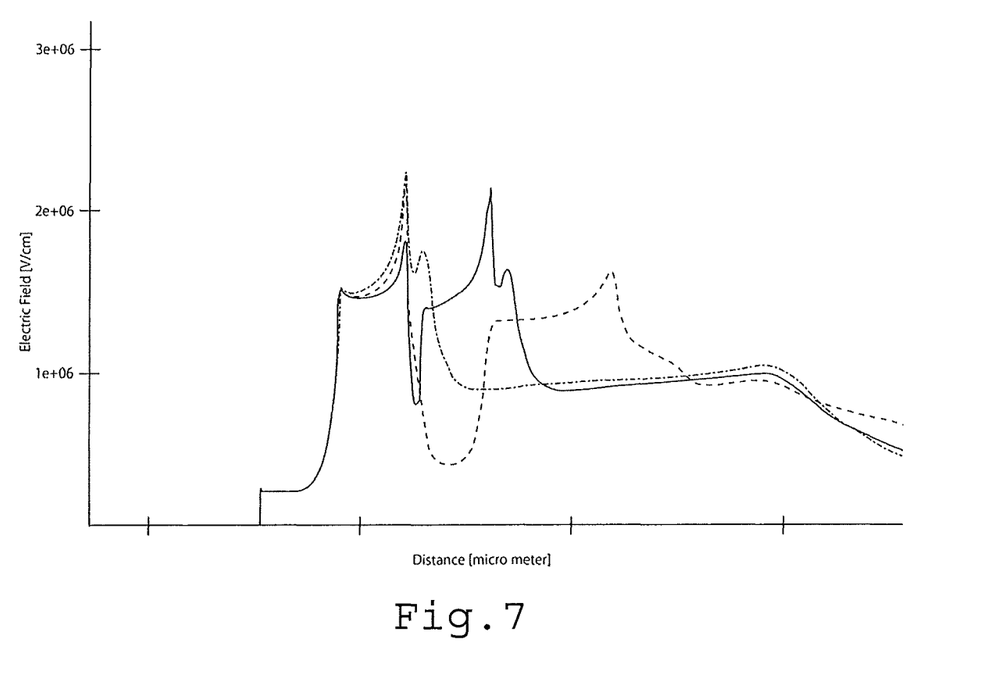
FIG. 7 is a graph for describing a function and an effect of an embodiment.
Figure 8:
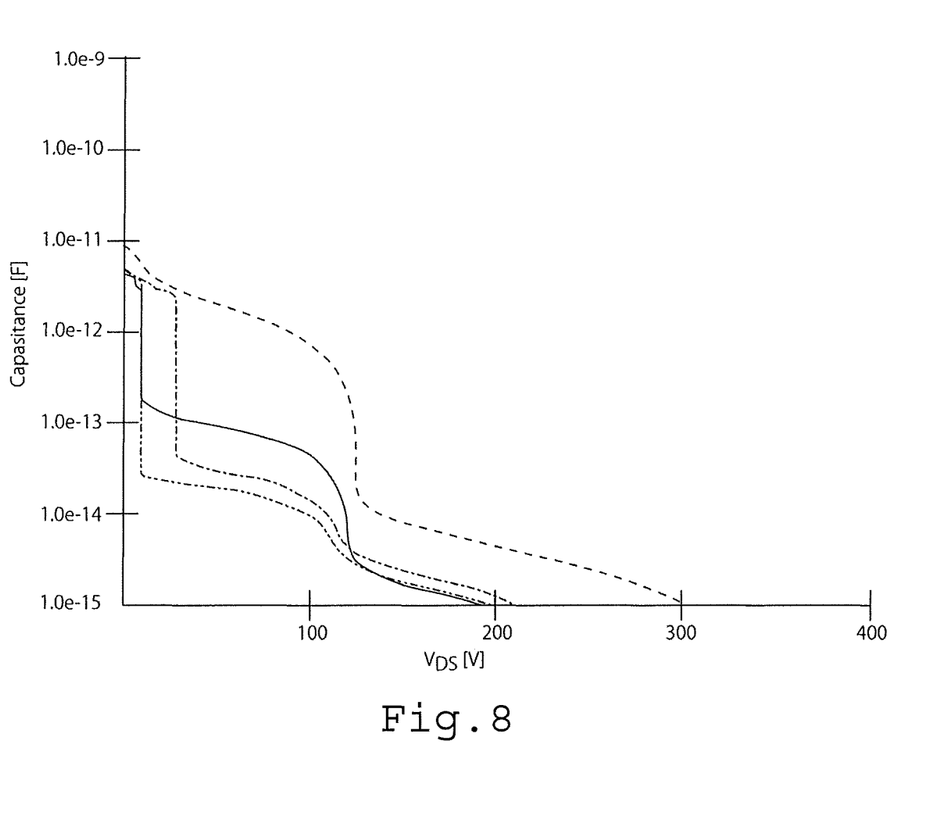
FIG. 8 is a graph for describing a function and an effect of an embodiment.

In FIG. 7 and FIG. 8, graphs for describing a function and an effect of an embodiment are illustrated. In FIG. 7 and FIG. 8, simulation results of a comparison form and an embodiment are illustrated. FIG. 7 is a graph illustrating a relationship between $Q_{GD}$ (vertical axis) and $V_{GS}$ (horizontal axis). FIG. 8 is a graph illustrating an electric field distribution (vertical axis) in a direction from a gate electrode 6 toward a drain electrode 7 (horizontal axis). A solid line indicates a characteristic of the semiconductor device 100 of the first embodiment. A dashed-dotted line indicates a characteristic of a semiconductor device that is a semiconductor device 100 from which a first field plate electrode 8 and a second field plate electrode 9 are omitted (comparison form). A broken line indicates a characteristic of a semiconductor device that is a semiconductor device 100 from which a first field plate electrode 8 is omitted (comparison form). A dashed-two dotted line illustrated in FIG. 8 indicates a characteristic of a semiconductor device that is a semiconductor device 100 from which a second field plate electrode 9 is omitted (corresponding to sixth embodiment). From FIG. 7 and FIG. 8, it is confirmed that a semiconductor device 100 of an embodiment has a good electric field distribution while reducing gate-to-drain capacitance. Also, in the semiconductor device corresponding to the sixth embodiment (dashed-two dotted line), $Q_{GD}$ is reduced compared to the comparison form. From the characteristic illustrated in FIG. 7, it is understood that the first field plate electrode 8 has a better effect of reducing gate-to-drain capacitance than the second field plate electrode 9.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first nitride semiconductor layer;
    a second nitride semiconductor layer placed on the first nitride semiconductor layer, the second nitride semiconductor layer having a larger bandgap than the first nitride semiconductor layer;
    a first electrode placed on the second nitride semiconductor layer, the first electrode being electrically connected to the first nitride semiconductor layer;
    a second electrode placed on the first nitride semiconductor layer, the second electrode being electrically connected to the first nitride semiconductor layer;
    a gate electrode placed between the first electrode and the second electrode;
    a first field plate electrode placed on the second nitride semiconductor layer, the first field plate electrode having the same height as the gate electrode; and
    a second field plate electrode provided on an upper side of the first field plate electrode, the second field plate electrode being placed on a side of the second electrode compared to the first field plate electrode.

2. The device according to claim 1, further comprising an insulation film between the first field plate electrode and the second field plate electrode.

3. The device according to claim 1, wherein the first field plate electrode and the second field plate electrode are electrically connected to the first electrode.

4. The device according to claim 1, further comprising a first conductive layer and a second conductive layer on the gate electrode,
wherein a distance between the first conductive layer and the second electrode is equal to or longer than a distance between the gate electrode and the second electrode, and
a distance between the second conductive layer and the second electrode is equal to or longer than the distance between the gate electrode and the second electrode.

5. The device according to claim 1, wherein a distance between the gate electrode and the first field plate electrode is longer than 0.0 μm and equal to or shorter than 10 μm.

6. The device according to claim 1, wherein the first field plate electrode and the second field plate electrode overlap with each other at least in a part in a laminate direction of the first nitride semiconductor layer and the second nitride semiconductor layer.

7. The device according to claim 1, wherein the gate electrode and the first field plate electrode are the same conductive material.

8. The device according to claim 1, further comprising a third field plate electrode placed on an upper side of the gate electrode, the third field plate electrode being extended in a direction of the second electrode, and the third field plate electrode being electrically connected with the first electrode, and
a fourth field plate electrode between the second field plate electrode and the second electrode.

9. A semiconductor device comprising:
a first nitride semiconductor layer;
a second nitride semiconductor layer placed on the first nitride semiconductor layer, the second nitride semiconductor layer having a larger bandgap than the first nitride semiconductor layer;
a first electrode placed on the first nitride semiconductor layer, the first electrode being electrically connected to the first nitride semiconductor layer;
a second electrode placed on the first nitride semiconductor layer, the second electrode being electrically connected to the first nitride semiconductor layer;
a gate electrode placed between the first electrode and the second electrode; and
a first field plate electrode directly in contact with the second nitride semiconductor layer, the first field plate electrode having the same height as the gate electrode.

* * * * *